US 12,446,278 B2

(12) United States Patent
Shen (10) Patent No.: US 12,446,278 B2
(45) Date of Patent: Oct. 14, 2025

(54) SEMICONDUCTOR DEVICE AND THE MANUFACTURING METHOD THEREOF

(71) Applicant: HON HAI PRECISION INDUSTRY CO., LTD., New Taipei (TW)

(72) Inventor: Yun-Hung Shen, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 414 days.

(21) Appl. No.: 18/162,694

(22) Filed: Jan. 31, 2023

(65) Prior Publication Data

US 2024/0213319 A1    Jun. 27, 2024

(30) Foreign Application Priority Data

Dec. 26, 2022  (TW) .................................. 111150021

(51) Int. Cl.
*H10D 62/13*   (2025.01)
*H01L 21/306*   (2006.01)
*H01L 21/3065*   (2006.01)
*H10D 30/01*   (2025.01)

(52) U.S. Cl.
CPC ..... *H10D 62/149* (2025.01); *H01L 21/30604* (2013.01); *H01L 21/3065* (2013.01); *H10D 30/01* (2025.01)

(58) Field of Classification Search
CPC .. H10D 62/149; H10D 62/822; H10D 64/027; H10D 30/01–0618; H10D 62/01–058; H01L 21/30604; H01L 21/3065; H01L 21/302; H01L 21/31116
See application file for complete search history.

(56) References Cited

U.S. PATENT DOCUMENTS

| | | |
|---|---|---|
| 2012/0302018 A1* | 11/2012 | Shin ................. H10D 30/797 257/E21.409 |
| 2014/0008700 A1 | 1/2014 | Rachmady et al. |
| 2017/0125591 A1 | 5/2017 | Giles et al. |
| 2022/0344206 A1 | 10/2022 | Hsiung et al. |
| 2022/0384268 A1 | 12/2022 | Chang et al. |
| 2022/0406920 A1 | 12/2022 | Chao et al. |

FOREIGN PATENT DOCUMENTS

| | | |
|---|---|---|
| TW | 201310549 A | 3/2013 |
| TW | 201511285 A | 3/2015 |

* cited by examiner

*Primary Examiner* — Moazzam Hossain
(74) *Attorney, Agent, or Firm* — CKC & Partners Co., LLC (57) ABSTRACT

A semiconductor device includes a substrate, a plurality of epitaxial structures and a plurality of gate structures. The substrate includes a plurality of recesses and a plurality of convex portions. Each of the convex portions is located between the two adjacent recesses, in which each of a sidewall of the recesses includes at least two concave portions. Each of the concave portions includes a first inclined plane and an adjacent second inclined plane. The second inclined plane of one of the concave portions is adjacent to a first inclined plane of another one of the concave portions, such that the sidewall has a zig-zag shape. The epitaxial structures are located in the recesses of the substrate respectively. The gate structures are located on the convex portions of the substrate respectively.

20 Claims, 6 Drawing Sheets

SEMICONDUCTOR DEVICE AND THE MANUFACTURING METHOD THEREOF

RELATED APPLICATIONS

This application claims priority to Taiwan Application Serial Number 111150021, filed Dec. 26, 2022, which is herein incorporated by reference.

BACKGROUND

Field of Disclosure

The present disclosure relates to a semiconductor device and a manufacturing method of the semiconductor device.

Description of Related Art

In the manufacturing of the transistors, the compressive force exerted by the epitaxial structures to the current channel between the epitaxial structures is crucial to the operation of the transistors. The existence of this compressive force results in the increase of charge mobility of the current channel, and thus increases the saturation current to keep the transistors well-functioning. However, the compressive force is mostly exerted by the tips of the epitaxial structures. Therefore, the amount of the tips significantly affects the magnitude of the compressive force and the magnitude of the saturation current when the transistors are operating, and thus affects the performance of the transistors.

SUMMARY

One aspect of the present disclosure provides a semiconductor device.

According to one embodiment of the present disclosure, a semiconductor device includes a substrate, a plurality of epitaxial structures and a plurality of gate structures. The substrate includes a plurality of recesses and a plurality of convex portions. Each of the convex portions is located between the two adjacent recesses, in which each of a sidewall of the recesses includes at least two concave portions. Each of the concave portions includes a first inclined plane and an adjacent second inclined plane. The second inclined plane of one of the concave portions is adjacent to a first inclined plane of another one of the concave portions, such that the sidewall has a zig-zag shape. The epitaxial structures are located in the recesses of the substrate respectively. The gate structures are located on the convex portions of the substrate respectively.

In some embodiments of the present disclosure, a sidewall of each of the epitaxial structures has at least two convex portions.

In some embodiments of the present disclosure, the convex portions of the epitaxial structures couples with the concave portions of the sidewalls of the recesses respectively.

In some embodiments of the present disclosure, a material of the epitaxial structures includes silicon germanium.

In some embodiments of the present disclosure, the convex portions of the epitaxial structures are configured to exert a compressive force to the concave portions of the substrate.

In some embodiments of the present disclosure, the first inclined planes of the concave portions are parallel to each other, and the second inclined planes of the concave portions are parallel to each other.

In some embodiments of the present disclosure, the semiconductor device further includes a shallow trench isolation (STI) located in the substrate, in which one of the epitaxial structures has a sidewall abuts against the STI, and the sidewall abuts against the STI has no convex portion.

In some embodiments of the present disclosure, a sidewall of the STI faces the sidewall abuts against the STI.

In some embodiments of the present disclosure, the sidewall of the STI has no concave portion.

In some embodiments of the present disclosure, one of the epitaxial structures abuts against the STI and has a top surface with an arc-shape, and the top surface extends from the STI to one of the gate structures.

One aspect of the present disclosure provides a semiconductor device.

According to one embodiment of the present disclosure, a semiconductor device includes a substrate, a plurality of epitaxial structures and a plurality of gate structures. The substrate includes a plurality of recesses and a plurality of convex portions. Each of the convex portions is located between the two adjacent recesses, in which each of a sidewall of the recesses includes at least two concave portions. Each of the concave portions includes a first inclined plane and an adjacent second inclined plane. The first inclined planes of the concave portions are parallel to each other, and the second inclined planes of the concave portions are parallel to each other. The epitaxial structures are located in the recesses of the substrate respectively. The gate structures are located on the convex portions of the substrate respectively.

In some embodiments of the present disclosure, a sidewall of each of the epitaxial structures has at least two convex portions.

In some embodiments of the present disclosure, the convex portions of the epitaxial structures couples with the concave portions of the sidewalls of the recesses respectively.

In some embodiments of the present disclosure, a material of the epitaxial structures includes silicon germanium.

In some embodiments of the present disclosure, the convex portions of the epitaxial structures are configured to exert a compressive force to the concave portions of the substrate.

One aspect of the present disclosure provides a manufacturing method of a semiconductor device.

According to one embodiment of the present disclosure, a manufacturing method of a semiconductor device includes forming a shallow trench isolation (STI), a plurality of gate structures and a plurality of first transition recesses on a substrate, in which the first transition recesses are located between the gate structures and between the STI and the gate structures closest to the STI; etching the first transition recesses to form a plurality of second transition recesses, in which a sidewall of each of the second transition recesses has a concave portion, in which the concave portion includes a first inclined plane and an adjacent second inclined plane; implanting an ion to the second transition recesses; etching the second transition recesses to form a plurality of recesses respectively, such that a sidewall of each of the recesses forms another concave portion, in which the concave portions includes a first inclined plane and an adjacent second inclined plane respectively, the second inclined plane of one of the concave portions is adjacent to a first inclined plane of another one of the concave portions, such that the sidewall has a zig-zag shape; and growing a plurality of epitaxial structures in the recesses respectively.

In some embodiments of the present disclosure, implanting the ion to the second transition recess includes implanting germanium ion to the second transition recess.

In some embodiments of the present disclosure, etching the second transition recesses is etching along the (111) lattice plane, such that the first inclined planes of the concave portions are parallel to each other, and the second inclined planes of the concave portions are parallel to each other.

In some embodiments of the present disclosure, forming the first transition recesses is performed by dry etching.

In some embodiments of the present disclosure, etching the first transition recesses is performed by wet etching.

In the aforementioned embodiments of the present disclosure, since a plurality of recesses with zig-zag-shaped sidewalls are etched through ion implantation and wet etching, such that when growing the epitaxial structures thereafter, epitaxial structures with more than one convex portions can be grown. As a result, the compressive force exert to the current channel by the epitaxial structures at both sides of the current channel can increase since both epitaxial structures has multiple tips, and thus increases charge mobility of the current channel and raise the saturation current, so that the transistors can operate with higher current.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the drawings. The spatially relative terms are intended to encompass different orientations of the device in use or operation in addition to the orientation depicted in the drawings. The apparatus may be otherwise oriented (rotated 90 degrees or at other orientations) and the spatially relative descriptors used herein may likewise be interpreted accordingly.

Figure 1:
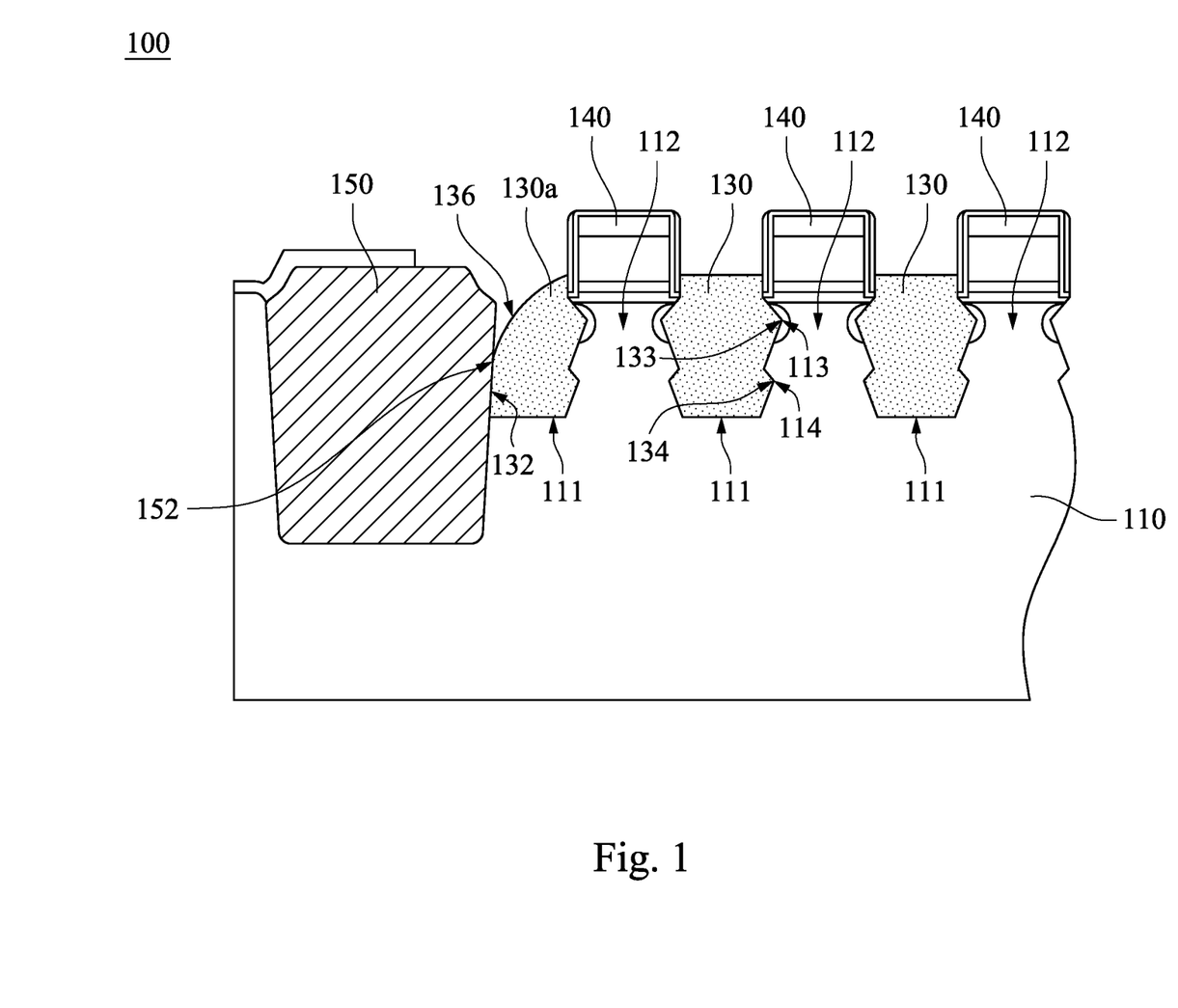
FIG. 1 is a cross-sectional view of a semiconductor device according to one embodiment of the present disclosure.
Figure 2:
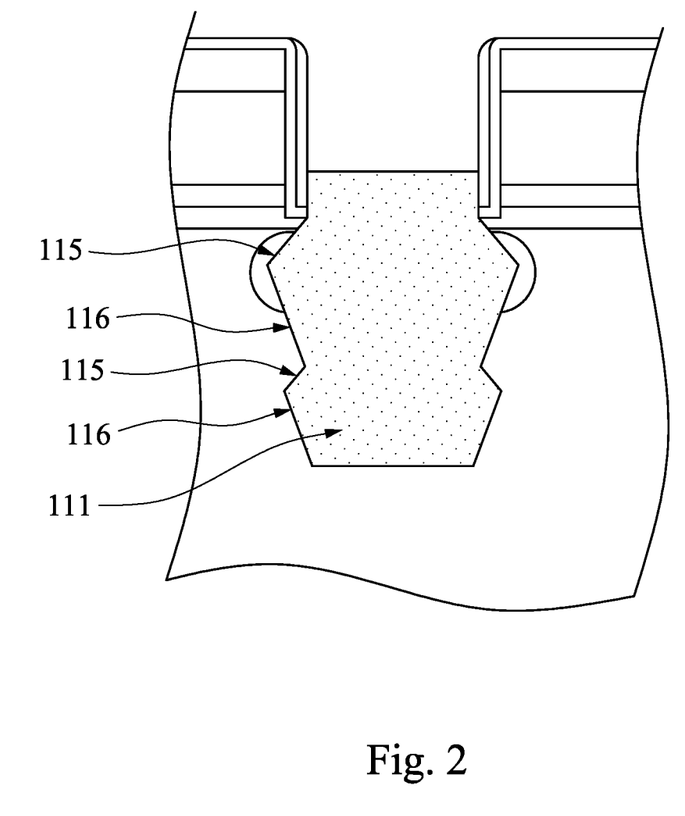
FIG. 2 is an enlarged view of the recess and the epitaxial structure of FIG. 1.

FIG. 1 is a cross-sectional view of a semiconductor device 100 according to one embodiment of the present disclosure. FIG. 2 is an enlarged view of the recess 111 and the epitaxial structure 130 of FIG. 1. Refer to FIG. 1 and FIG. 2, a semiconductor device 100 includes a substrate 110, a plurality of epitaxial structures 130,130a and a plurality of gate structures 140. The substrate includes a plurality of recesses 111 and a plurality of convex portions 112. Each of the convex portions 112 is located between the two adjacent recesses 111. Moreover, each of the sidewall of the recesses 111 includes at least two concave portions 113, 114, and the concave portions 113 and 114 include a first inclined plane 115 and an adjacent second inclined plane 116. The second inclined plane 116 of one of the concave portions 113 is adjacent to a first inclined plane 115 of another one of the concave portions 114, such that the sidewall has a zig-zag shape. The epitaxial structures 130, 130a are located in the recesses 111 of the substrate 110 respectively. The gate structures 140 are located on the convex portions 112 of the substrate 110 respectively. A sidewall of each of the epitaxial structures 130 has at least two convex portions 133, 134. The convex portions 133, 134 of the epitaxial structures 130 couples with the concave portions 113, 114 of the sidewalls of the recesses 111 respectively.

In some embodiments, the material of the epitaxial structures 130, 130a includes silicon germanium, but not limited to this. For example, the epitaxial structure 130 can be a composite structure with multiple epitaxial layers or a doped layer, and can also be doped with other elements, such as boron. The convex portions 133, 134 of the epitaxial structures 130 are configured to exert a compressive force to the concave portions 112 of the substrate 110. This compressive force is not exerted only from the convex portions 133, 134, but most of the compressive force is provided by the convex portions 133, 134. The first inclined planes 115 of the concave portions 113, 114 are parallel to each other, and the second inclined planes 116 of the concave portions 113, 114 are parallel to each other.

Since the sidewalls of the recesses 111 have a zig-zag shape, the epitaxial structure 130 has more than one convex portion 133, 134. As a result, the compressive force exerted to the current channel in the convex portions 112 by the epitaxial structures 130 at both sides of the current channel can increase since both epitaxial structures 130 has multiple convex portions 133, 134. In FIG. 1, the epitaxial structure 130 has two convex portions 133, 134, but in other embodiments, the epitaxial structure 130 can have more than two convex portions. Since most of the compressive force is provided by the convex portions 133, 134, the greater amount of convex portions the epitaxial structure has, the larger the compressive force it can exert to the current channel in the convex portions 112 of the substrate 110, and thus increases charge mobility of the current channel and raise the saturation current.

In the present embodiment, the semiconductor device 100 further includes a shallow trench isolation (STI) 150 located in the substrate 110, in which one of the epitaxial structures 130a has a sidewall 132 abuts against the STI 150, and the sidewall 132 of the epitaxial structure 130a abuts against the STI 150 has no convex portion. It is to be noted that the term "abut against" in this disclosure means the two objects contact each other. A sidewall 152 of the STI 150 faces the sidewall 132 of the epitaxial structures 130a abuts against the STI 150, and the sidewall 152 of the STI 150 has no concave portion. Moreover, since a side (e.g. the left side of the epitaxial structures 130a of FIG. 1) of the epitaxial structures 130a is close to the STI 150, the epitaxial structures 130a has a top surface 136 with an arc-shape, and the top surface 136 with an arc-shape extends from the STI 150 to one of the gate structures 140.

It is to be noted that the connection relationships, the materials, and the advantages of the elements described above will not be repeated in the following description. In the following description, a manufacturing method of the semiconductor device is described.

Figure 3:
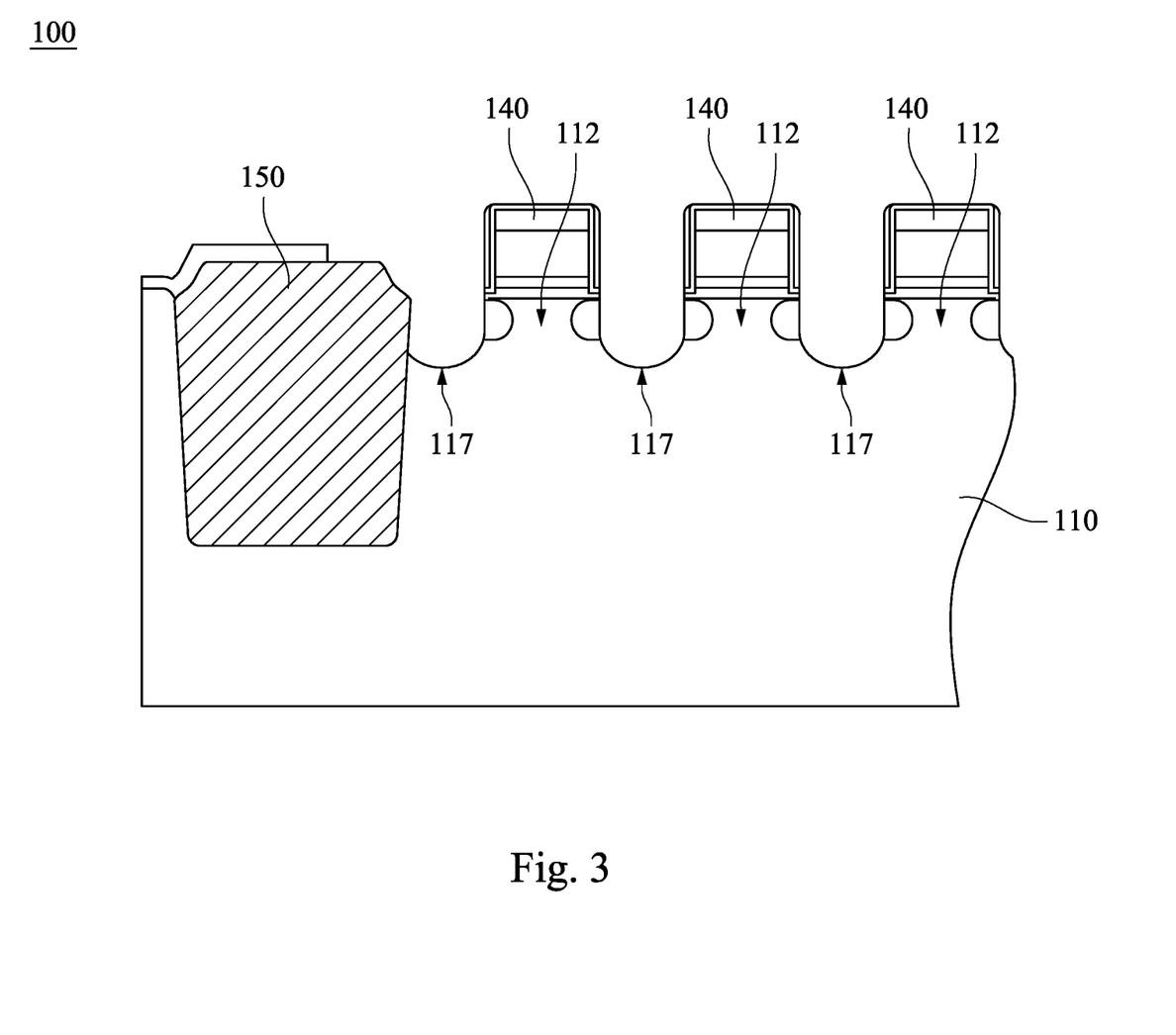
FIG. 3 to FIG. 6 are cross-sectional views at intermediate steps of a manufacturing method of the semiconductor device of FIG. 1.

FIG. 3 to FIG. 6 are cross-sectional views at intermediate steps of a manufacturing method of the semiconductor device 100 of FIG. 1. Refer to FIG. 3, a manufacturing method of the semiconductor device 100 includes forming a shallow trench isolation (STI) 150, a plurality of gate structures 140 and a plurality of first transition recesses 117 on a substrate 110, in which the first transition 117 recesses are located between the gate structures 140 and between the STI 150 and the gate structures 140 closest to the STI 150. Forming the first transition recesses 117 is performed by dry etching. The plasma free radical used for dry etching includes hydrobromic acid (HBr), chlorine ($Cl_2$) and hydrogen gas ($H_2$), but not limited to these.

Figure 4:
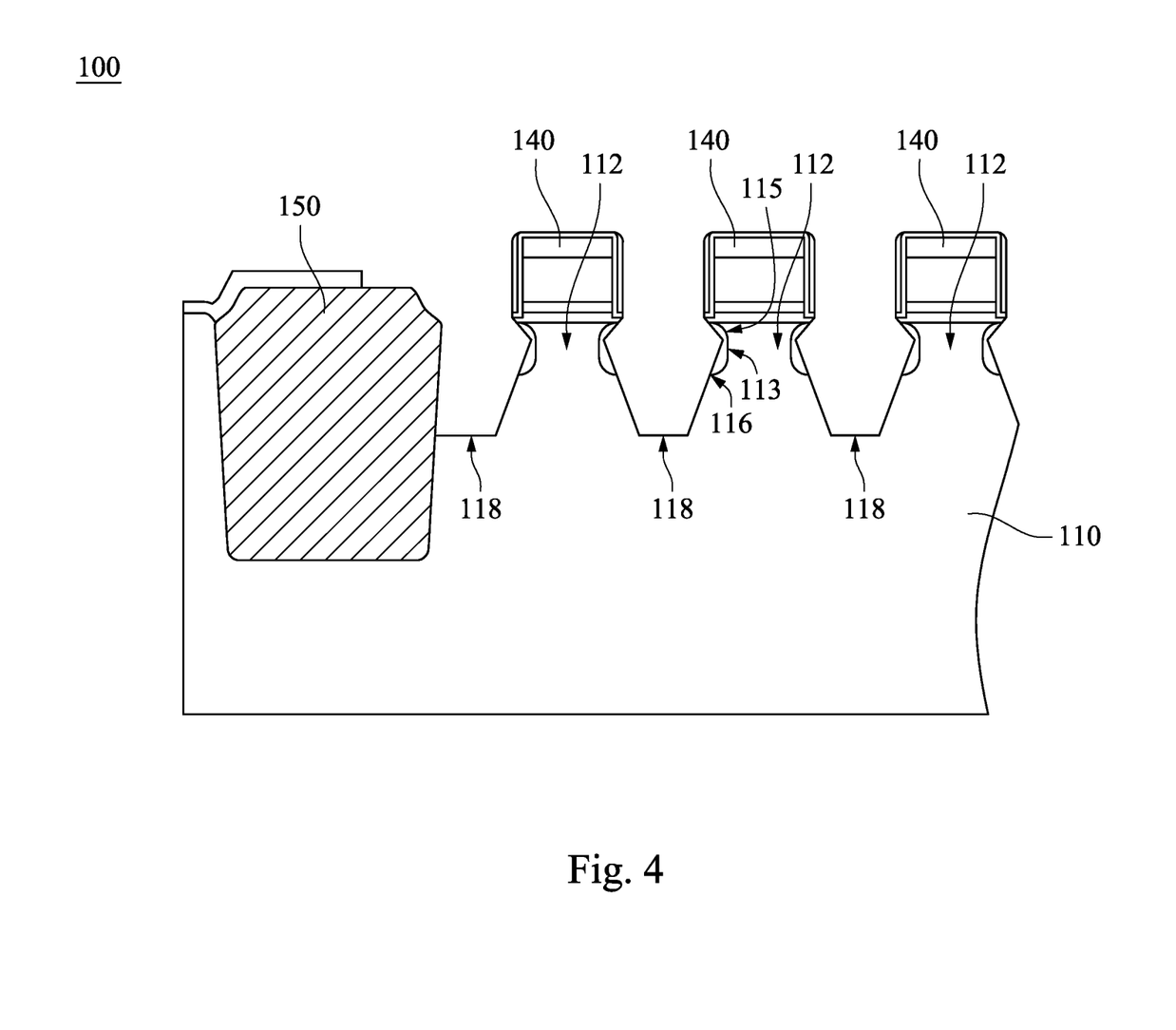

Refer to FIG. 4, thereafter, etching the first transition 117 recesses to form a plurality of second transition recesses 118, in which a sidewall of each of the second transition recesses 118 has a concave portion 113, and the concave portion 113 includes a first inclined plane 115 and an adjacent second inclined plane 116. Etching the first transition recesses 117 is performed by wet etching. The solution for wet etching can be tetramethylammonium hydroxide (TMAH), but not limited to this. In the present embodiment, the wet etching is etching along the (111) lattice plane, such that the angle between the first inclined plane 115 that is formed by the etching process and the horizontal plane is 45 degree.

Figure 5:
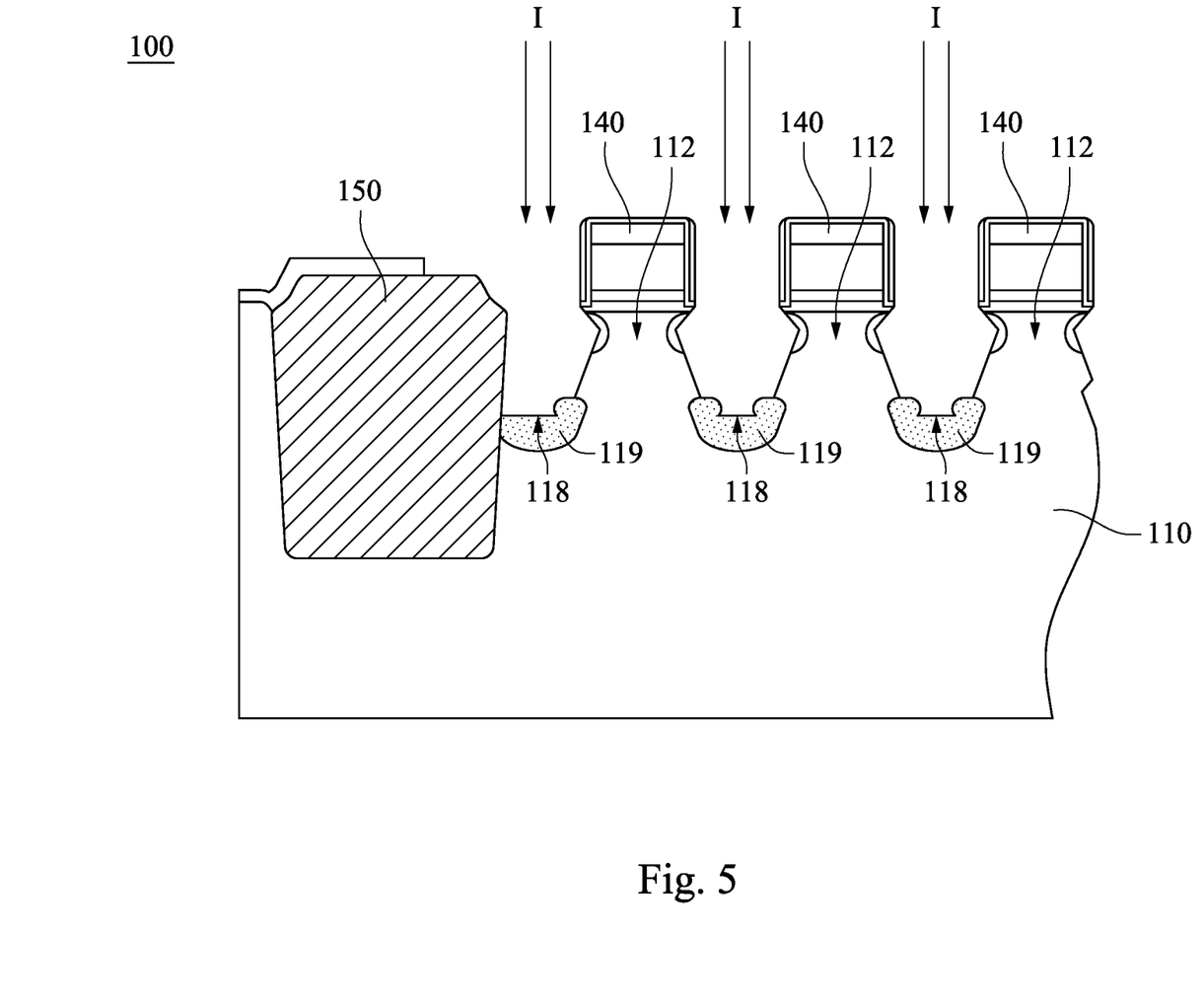

Refer to FIG. 5, after the second transition recesses 118 is formed, implanting an ion I to the second transition recesses 118. Implanting the ion I to the second transition recess 118 includes implanting germanium ion ($Ge^{4+}$) to the second transition recess 118. In the present embodiment, all of the second transition recess 118 will have the ion I implanted and form a transition area 119 that contains the ion I. The purpose of the process is to accelerate the etching process in the next step and to control the direction of etching.

Figure 6:
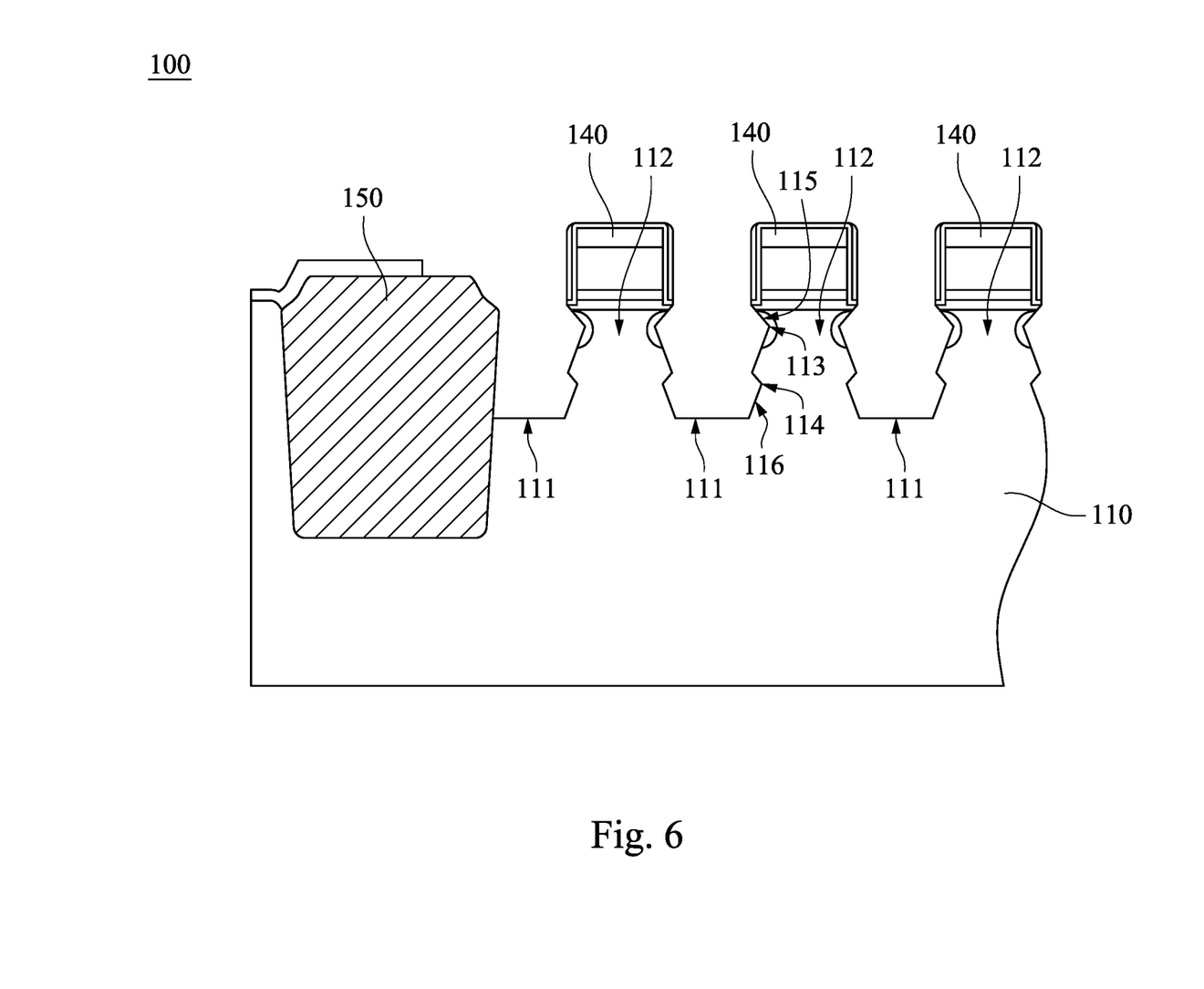

Refer to FIG. 6, thereafter, a wet etching process can be performed to etch the second transition recesses 118 to form a plurality of recesses 111 respectively, such that a sidewall of each of the recesses 111 forms another concave portion 114, in which the concave portions 113, 114 includes a first inclined plane 115 and an adjacent second inclined plane 116 respectively, the second inclined plane 116 of one of the concave portions 113 is adjacent to the first inclined plane 115 of another one of the concave portions 114, such that the sidewall has a zig-zag shape. Since the solution used in wet etching will etch the concave portions 113 formed first and the concave portions 114 formed later, the etching of the concave portions 114 needs to be faster than the etching of the concave portions 113. The silicon substrate with germanium (i.e. the substrate 110 of FIG. 5) will be etched faster than a pure silicon substrate under the same solution, such that the size of the concave portions 114 formed later will not have a great difference to the concave portions 113 formed first.

In the present embodiment, etching the second transition recesses 118 is etching along the (111) lattice plane, such that the first inclined planes 115 of the concave portions 113, 114 are parallel to each other, and the second inclined planes 116 of the concave portions 113, 114 are parallel to each other. Since both steps of wet etching are etching along the (111) lattice plane, the first inclined planes 115 are parallel to each other and the second inclined planes 116 are parallel to each other, the angle between the two is about 90 degree. The solution for etching the second transition recesses 118 and the solution of the first wet etching can both be TMAH, but not limited to this. In this step, the substrate 110 implanted with germanium will be totally etched, and remains the concave portion 114. Since the distribution of the ion when implanting is a second order polynomial, when etching downward and sideward at the same time, the place where the slope of the second order polynomial turns from positive to negative will form the concave portion 114.

In particular, since the concave portions 113, 114 is etched along the (111) lattice plane of silicon in the two steps of wet etching described above respectively, such that the epitaxial structures 130 (see FIG. 1) grown along the recesses 111 in the step of epitaxial growth thereafter will have at least two convex portions 133, 134, so that the compressive force exerts to the current channel in between can significantly increase through increasing the amount of the convex portions.

Refer to FIG. 5 and FIG. 6, the steps of implanting the ion I and etching the second transition recesses 118 can be repeated for more than one time to form more concave portions. The amount of the concave portions 113, 114 shown in FIG. 6 is only two, but the steps can repetitively etch to form more concave portions, such that the epitaxial structure 130 grown along the recesses 111 in the step of epitaxial growth thereafter will have at least two convex portions 133, 134. Since the compressive force exert by the source/drain region formed by the epitaxial structures 130 to the current channel between the two epitaxial structures 130 is crucial to the operation of the transistors, and the compressive force is mostly from the convex portions 133, 134 of the epitaxial structures 130, the amount of the convex portions will significantly affect the magnitude of the compressive force and the saturation current, which is the reason why the repetition of these two steps is of great influence of the manufacturing and the operation of the transistor later on.

Refer to FIG. 1 and FIG. 6, thereafter, growing a plurality of epitaxial structures 130, 130a in the recesses 111 respectively. The growth of the epitaxial structures 130, 130a can include more than one step. For example, a pure silicon germanium epitaxy can be grown first, and then dope boron group atoms to form a doped layer, but not limited to this. As a result, the semiconductor device 100 of FIG. 1 is manufactured. Since the recesses 111 with zig-zag-shaped sidewalls are etched through ion implantation and wet etching, such that when growing the epitaxial structures 130 thereafter, the epitaxial structures 130 with more than one convex portions 133, 134 can be grown. As a result, the compressive force exert to the current channel in the convex portion 112 by the epitaxial structures 130 at both sides of the current channel can increase since both epitaxial structures 130, 130a has multiple convex portions 133, 134, and thus increases charge mobility of the current channel and raise the saturation current, so that the transistors can operate with higher current.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate comprising a plurality of recesses and a plurality of convex portions, wherein each of the convex portions is located between the two adjacent recesses, each of a sidewall of the recesses includes at least two concave portions, each of the concave portions comprises a first inclined plane and an adjacent second inclined plane, and the second inclined plane of one of the concave portions is adjacent to a first inclined plane of another one of the concave portions, such that the sidewall has a zig-zag shape;
a plurality of epitaxial structures located in the recesses of the substrate respectively, wherein top surfaces of the epitaxial structures are higher than top surfaces of the convex portions of the substrate; and
a plurality of gate structures located on the convex portions of the substrate respectively wherein sidewalls gate structures are in contact with the epitaxial structures.

2. The semiconductor device of claim 1, wherein a sidewall of each of the epitaxial structures has at least two convex portions.

3. The semiconductor device of claim 2, wherein the convex portions of the epitaxial structures couples with the concave portions of the sidewalls of the recesses respectively.

4. The semiconductor device of claim 2, wherein a material of the epitaxial structures comprises silicon germanium.

5. The semiconductor device of claim 2, wherein the convex portions of the epitaxial structures are configured to exert a compressive force to the concave portions of the substrate.

6. The semiconductor device of claim 1, wherein the first inclined planes of the concave portions are parallel to each other, and the second inclined planes of the concave portions are parallel to each other.

7. The semiconductor device of claim 1, wherein the semiconductor device further comprises:
a shallow trench isolation (STI) located in the substrate, wherein one of the epitaxial structures has a sidewall abuts against the STI, and the sidewall abuts against the STI has no convex portion.

8. The semiconductor device of claim 7, wherein a sidewall of the STI faces the sidewall abuts against the STI.

9. The semiconductor device of claim 8, wherein the sidewall of the STI has no concave portion.

10. The semiconductor device of claim 8, wherein one of the epitaxial structures abuts against the STI and has one of the top surfaces with an arc-shape, and the top surface with the arc-shape extends from the STI to one of the gate structures.

11. A semiconductor device, comprising:
a substrate comprising a plurality of recesses and a plurality of convex portions, wherein each of the convex portions is located between the two adjacent recesses, each of a sidewall of the recesses includes at least two concave portions, each of the concave portions comprises a first inclined plane and an adjacent second inclined plane, the first inclined planes of the concave portions are parallel to each other, and the second inclined planes of the concave portions are parallel to each other;
a plurality of epitaxial structures located in the recesses of the substrate respectively, wherein top surfaces of the epitaxial structures are higher than the top surfaces of the convex portions of the substrate; and
a plurality of gate structures located on the convex portions of the substrate respectively, wherein sidewalls of the gate structures are in contact with the epitaxial structures.

12. The semiconductor device of claim 11, wherein a sidewall of each of the epitaxial structures has at least two convex portions.

13. The semiconductor device of claim 12, wherein the convex portions of the epitaxial structures couples with the concave portions of the sidewalls of the recesses respectively.

14. The semiconductor device of claim 12, wherein a material of the epitaxial structures comprises silicon germanium.

15. The semiconductor device of claim 12, wherein the convex portions of the epitaxial structures are configured to exert a compressive force to the concave portions of the substrate.

16. A manufacturing method of a semiconductor device, comprising:
forming a shallow trench isolation (STI), a plurality of gate structures and a plurality of first transition recesses on a substrate, wherein the first transition recesses are located between the gate structures and between the STI and the gate structures closest to the STI;
etching the first transition recesses to form a plurality of second transition recesses, wherein a sidewall of each of the second transition recesses has a concave portion, wherein the concave portion comprises a first inclined plane and an adjacent second inclined plane;
after etching the first transition recesses, implanting an ion to the second transition recesses;
after implanting the ion to the second transition recesses, etching the second transition recesses to form a plurality of recesses respectively, such that a sidewall of each of the recesses forms another concave portion, wherein the concave portions comprises a first inclined plane and an adjacent second inclined plane respectively, the second inclined plane of one of the concave portions is adjacent to a first inclined plane of another one of the concave portions, such that the sidewall has a zig-zag shape; and
after etching the second transition recesses, growing a plurality of epitaxial structures in the recesses respectively.

17. The manufacturing method of the semiconductor device of claim 16, wherein implanting the ion to the second transition recesses comprises implanting germanium ion to the second transition recesses.

18. The manufacturing method of the semiconductor device of claim 16, wherein etching the second transition recesses is etching along a (111) lattice plane, such that the first inclined planes of the concave portions are parallel to each other, and the second inclined planes of the concave portions are parallel to each other.

19. The manufacturing method of the semiconductor device of claim 16, wherein forming the first transition recesses is performed by dry etching.

20. The manufacturing method of the semiconductor device of claim 16, wherein etching the first transition recesses is performed by wet etching.

* * * * *